United States Patent
Sakamaki et al.

(10) Patent No.: US 6,247,799 B1
(45) Date of Patent: Jun. 19, 2001

(54) FERROELECTRIC ELEMENT, PROCESS FOR PRODUCING THE SAME, AND INK JET HEAD

(75) Inventors: Shinichi Sakamaki; Yukimi Takahashi; Yorinobu Yamada, all of Tokorozawa; Motoyuki Toki; Mamoru Aizawa, both of Kyoto, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/499,686

(22) Filed: Feb. 8, 2000

Related U.S. Application Data

(62) Division of application No. 09/011,959, filed as application No. PCT/JP97/00659 on Mar. 4, 1997.

(30) Foreign Application Priority Data

| Sep. 12, 1996 | (JP) | 8-241569 |
|---|---|---|
| Oct. 28, 1996 | (JP) | 8-285215 |
| Oct. 28, 1996 | (JP) | 8-285216 |

(51) Int. Cl.[7] .............. B41J 2/045; B05D 5/12
(52) U.S. Cl. .......... 347/68; 427/100; 427/126.3
(58) Field of Search .................. 347/68; 310/328; 437/60; 257/295; 427/100, 126.3

(56) References Cited

U.S. PATENT DOCUMENTS

| 4,946,710 | * | 8/1990 | Miller et al. | 427/126.3 |
|---|---|---|---|---|
| 5,175,027 | | 12/1992 | Farley et al. | 427/395.5 |
| 5,608,091 | | 3/1997 | Masuda et al. | 552/250 |
| 5,691,593 | * | 11/1997 | Takeuchi et al. | 310/328 |
| 5,776,788 | * | 7/1998 | Aoki et al. | 437/60 |
| 5,835,121 | | 10/1998 | Shimada | 310/358 |

FOREIGN PATENT DOCUMENTS

| 60-98691 | | 6/1985 | (JP) . | |
|---|---|---|---|---|
| 05221643 | * | 12/1991 | (JP) | B01J/19/00 |
| 4-257431 | | 9/1992 | (JP) . | |
| 5-221643 | | 8/1993 | (JP) . | |
| 5-270893 | | 10/1993 | (JP) . | |
| 6-64970 | | 3/1994 | (JP) . | |
| 6-297720 | | 10/1994 | (JP) . | |
| 6-305714 | | 11/1994 | (JP) . | |
| 7-267731 | | 10/1995 | (JP) . | |

* cited by examiner

Primary Examiner—John Barlow
Assistant Examiner—An H. Do
(74) Attorney, Agent, or Firm—Finnegan, Henderson, Farabow, Garrett & Dunner, L.L.P.

(57) ABSTRACT

A ferroelectric element, having a ferroelectric material containing at least two metals, the ferroelectric element having been produced by a process including the steps of: providing alkoxides of the respective metals as starting compounds; hydrolyzing the metal alkoxides in the presence of a catalytic amount of a protonic acid to increase the molecular weight; and adding a film-forming polymer material to the sol-like solution prepared in the step of increasing the molecular weight to prepare a sol-like ferroelectric precursor solution. The ferroelectric element can be formed in a thick film form without creating any cracks. It can be advantageously used as a piezoelectric element in a piezoelectric ink jet head.

7 Claims, 8 Drawing Sheets

FERROELECTRIC ELEMENT, PROCESS FOR PRODUCING THE SAME, AND INK JET HEAD

This is a division of application Ser. No. 09/011,959 filed Feb. 23, 1998, which is a 371 of PCT/JP97/00659, filed Mar. 4, 1997—all of which are incorporated herein by reference.

TECHNICAL FIELD

The present invention relates to a ferroelectric element and, more particularly, to a ferroelectric element which is-advantageously usable as a piezoelectric element in ink jet printers and other devices. The ferroelectric element according to the present invention, as compared with the conventional ferroelectric element, can be a thick film having a thickness of 10 to 20 μm and, at the same time, can avoid cracking at the time of the film formation. Further, since fine particles of a ferroelectric precursor can be previously formed in the course of preparation of the ferroelectric element by a sol-gel process, a more dense element can be prepared in a shorter time. Furthermore, the ferroelectric element of the present invention can be advantageously produced from a green sheet thereof. In this case, the firing temperature may be lower than that in the prior art process, and the range of selection of an electrode material to be placed on both ends of the green sheet necessary for the development of ferroelectricity and piezoelectricity can be broadened. The present invention also relates to a process for producing the above ferroelectric element and a piezoelectric ink jet head using the above ferroelectric element as a piezoelectric element. The term "piezoelectric" and the term "ferroelectric" used herein are defined as follows. Materials, which, when an external force (a stress from the outside) is applied to a crystal thereof, develop polarization, are called piezoelectrics, and, among the piezoelectrics, those wherein the polarization can be reversed by an external electric field are expressly called ferroelectrics.

BACKGROUND ART

In recent years, in office automation (OA) equipment, such as word processors, personal computers, facsimile machines, various measuring instruments, such as medical measuring instruments, and other devices, ink jet printers have been extensively used for printing information from these devices at a high density. As well known in the art, in the ink jet printer, an ink droplet is ejected from a head section of the printer and deposited directly onto a recording medium, such as recording paper, to perform monochrome or color printing. The ink jet printer has many advantages including that printing can be performed on even a three-dimensional recording medium, running cost is low since plain paper can be used as the recording medium, the head can be simply loaded, the need to provide the step of transfer, fixation and the like can be eliminated, color printing is easily performed, and a sharp color printed image can be provided. The head section of the ink jet printer can be classified into several types according to the method for ejecting ink droplets from the head section. Among them, a typically and advantageously used one is a piezoelectric ink jet head.

The piezoelectric ink jet head generally comprises: a plurality of ink chambers which are disposed at equidistant spaces and function as an ink flow passage and a pressurizing chamber for ejecting an ink; and a nozzle plate mounted on the front end of the ink chambers and equipped with nozzles, for ejecting an ink, corresponding respectively to the ink chambers; and pressurizing means for pressurizing an ink within the ink chamber in response to a demand for printing. The pressurizing means comprises a piezoelectric element, and an electrostrictive effect attained by this piezoelectric element is utilized to create a pressure wave within the ink chamber, filled with an ink, in the head section, permitting the ink to be ejected through the nozzle in the head section.

Ferroelectric elements have been extensively used as a piezoelectric element in the above ink jet head or as, for example, capacitors, actuators, memories, and other elements. A ferroelectric element consists essentially of a ferroelectric body or a ferroelectric material. Examples of typical ferroelectric materials include lead zirconate titanate (PZT) generally represented by $Pb(Zr,Ti)O_3$, $(Pb,La)(Zr,Ti)O_3$ (PLZT), and $Pb(Mg_{1/3}Nb_{2/3})O_3$ (PMN). In particular, it is known that ferroelectrics containing lead (Pb) as one metal component, including PZT, have large remanence, specific permittivity, and piezoelectric constant and possess excellent piezoelectricity and ferroelectricity. In the present specification, the ferroelectric material will be described particularly with reference to PZT.

The above ferroelectric elements, particularly thin film elements of PZT, have hitherto been produced by various film forming methods, such as sputtering, sol-gel process, CVD, and laser ablation, or methods related thereto. When the thin film element is formed particularly in a large thickness of 10 to 20 μm, a method has been used wherein the film thickness is increased by prolonging the film formation time or by repeating the film formation procedure. Further, when a PZT element having a perovskite structure is produced, firing is generally performed in a high temperature atmosphere of 500 to 800° C.

Among the film formation methods, the sol-gel process which is particularly included in the range of a solution preparation method is advantageous in that a high-purity thin film of PZT can be formed, a starting material can be quantitatively dissolved in a solution and, hence, the composition of the formed thin film of PZT can reflect the composition of the starting material used, which facilitates the control of the composition and can provide a thin film of PZT having high surface smoothness by repetition of spin coating and firing. The solvent used in the preparation of a sol-gel solution is in many cases an alcohol solvent because the metal for PZT takes the form of a metal alkoxide or a metal salt of an organic carboxylic acid. The solution prepared by the sol-gel process may be coated onto a substrate, for example, by spin coating or dip coating to form a film. In this film formation, addition of a photosensitive resin to the solution enables patterning by photoetching.

More specifically, for example, Japanese Unexamined Patent Publication (Kokai) No. 6-112550 discloses a method for forming a thin film of PZT which comprises hydrolyzing a metal alkoxide as a PZT material to prepare a sol solution, adding a soluble organic polymer, for example, polyethylene glycol monomethyl ether, to the solution and thoroughly stirring the solution. Subsequently, a platinum electrode is formed on a silicon substrate, a sol solution prepared above is spin-coated on the electrode, and the coating is heated to about 350° C. The prefiring results in the formation of a porous thin film of a gel. The same starting material as the above PZT material is hydrolyzed to form a sol solution. In this case, however, no polyethylene glycol monomethyl ether is added. The sol solution is spin-coated onto the above porous thin film of a gel to form a coating which is then dried by heating at 400° C. The resultant thin film is fired in an oxygen atmosphere for 15 hr. The firing temperature is generally 600 to 700° C. Thus, a thin film of PZT having a perovskite structure can be formed through a series of steps. In this film formation method, a sol is filled into pores of the porous thin film of a gel. This reduces the porosity and can offer high Young's modulus and consequently excellent electric properties. Further, since the size of the pore is not more than 1 µm, no cracks are created.

Japanese Unexamined Patent Publication (Kokai) No. 6-119811 discloses a process for producing a ferroelectric thin film element, comprising producing a ferroelectric thin film by a sol-gel process using a metal alkoxide as a main starting material, wherein particles of a ferroelectric oxide are added to a sol prepared by hydrolyzing the starting material followed by homogeneous mixing to prepare a coating liquid. In this film formation method, addition of ferroelectric oxide particles to the sol enables a thick film to be easily formed and, in addition, results in the formation of a thin film of PZT having excellent properties and electric characteristics.

When all the above prior art methods are taken into consideration, it can be said that, in the conventional methods for producing a ferroelectric element, it is very difficult to produce a ferroelectric thin film element having a relatively large thickness of 1 µm or more. Further, according to a sol-gel process which can generally provide a film of a submicron thickness, repetition of coating of a coating solution prepared by the sol-gel process can provide a thick film. In this case, however, it is difficult to form a dense film having excellent qualities.

Further, the formation of the thick film poses a problem that cracking is often created to make it impossible to provide ferroelectric properties. Specifically, for example, coating of an aqueous PZT precursor solution by a conventional method, such as dip coating or spin coating, followed by drying, degreasing and firing to form a thin film of PZT having a thickness of not less than 1 µm often results in the creation of cracking. The creation of cracking could not be avoided even when the thin film of PZT is formed by stacking a plurality of thinner films on top of another. Creation of cracking in the thin film of PZT results in lowered film density, makes it impossible to form an element, such as an electrode, on the top surface of the film, and, hence, makes it impossible to utilize the thin film of PZT, for example, as a piezoelectric element of an ink jet head. In fact, since the film thickness of the piezoelectric element used in the head of the ink jet printer is generally about 10 to 20 µm, the conventional methods are unsatisfactory also from the practical viewpoint.

Referring again to Japanese Unexamined Publication (Kokai) No. 6-119811, as described above, it teaches that, in the preparation of a thin film of PZT by the sol-gel process, after the preparation of a PZT sol-gel solution, separately prepared fine particles of PZT are mixed with the PZT sol-gel solution to prepare a homogeneous coating liquid. This method, however, is troublesome because the PZT sol-gel solution and the fine particles of PZT to be added to the PZT sol-gel solution should be prepared separately. Further, a PZT sol-gel solution is prepared by the method which is different from the method by which the fine particles of PZT are prepared. Therefore, in the addition of the fine particles to the sol-gel solution, it is difficult to achieve homogeneous dispersion.

Preparation of a ferroelectric element through a green sheet of a precursor to the ferroelectric element has also been extensively carried out in the art. In this preparation method, in general, a fine powder of a ferroelectric material is mixed with a suitable binder material and a solvent, and the resultant mixed liquid is formed into a sheet by using a coating device, such as a doctor blade or a roll coater, or screen printing. The green sheet is fired at 1000° C. or above, and a conductive paste is coated thereon, followed by firing at the firing temperature of the conductive paste. In this method, however, the adoption of a high temperature of 1000° C. or above as the firing temperature poses a problem that elements constituting the dielectric are unfavorably evaporated during firing, leading to a variation in composition ratio in the resultant ferroelectric and, hence, rendering the control of the composition ratio difficult. The high-temperature firing poses an additional problem that the electrode material to be coated onto a green sheet for developing the ferroelectricity and the piezoelectricity is limited to those having heat resistance.

DISCLOSURE OF THE INVENTION

An object of the present invention is to eliminate the above many problems in the prior art.

It is therefore an object of the present invention to provide a ferroelectric element wherein the film thickness can be easily increased by the sol-gel process without creating any cracks in the film and the film has quality sufficient for practical use, and, at the same time, is dense.

It is another object of the present invention to provide a ferroelectric element, produced by a process involving the step of adding fine particles of a ferroelectric precursor to a sol-gel solution of the ferroelectric precursor, wherein the fine particles of a ferroelectric precursor can be produced in situ in a sol-gel solution in the course of preparing the sol-gel solution and, hence, the need to specially prepare fine particles of the ferroelectric precursor in other sites can be eliminated.

It is still another object of the present invention to provide a ferroelectric element which, as a result of the in-situ production of fine particles of a ferroelectric precursor in a sol-gel solution, can omit the time necessary for the intentional preparation of fine particles, permits fine particles to be homogeneously dispersed in a sol-gel solution and, therefore, can be provided in a denser thin film form.

It is a further object of the present invention to provide a ferroelectric element which, particularly when a ferroelectric element is prepared through a green sheet of the precursor, permits the composition ratio in the ferroelectric to be easily controlled, enables the firing temperature to be lowered, and enables the range of selection of an electrode material for providing ferroelectricity and piezoelectricity to be broadened.

In addition to the above objects, an additional object of the present invention is to provide a process for producing the above excellent ferroelectric element.

Another object of the present invention is to provide a piezoelectric ink jet head using the ferroelectric element of the present invention as a piezoelectric element.

The above and other objects of the present invention could be easily understood from the following detailed description.

According to one aspect of the present invention, there is provided a ferroelectric element, comprising a ferroelectric material containing at least two metals, said ferroelectric element having been produced by a process comprising the steps of: providing alkoxides of the respective metals as starting compounds; hydrolyzing the metal alkoxides in the presence of a catalytic amount of a protonic acid to increase the molecular weight; and adding a film-forming polymer material to the sol-like solution prepared in the step of increasing the molecular weight to prepare a sol-like ferroelectric precursor solution.

In the ferroelectric element according to the present invention, preferably, the sol-like ferroelectric precursor solution further comprises fine particles of a ferroelectric precursor produced in situ in the course of the preparation of the sol-like ferroelectric precursor solution. In this case, preferably, the fine particles of the ferroelectric precursor have been produced by adding a binder material, to the ferroelectric precursor solution, in an amount effective in accelerating the gelation.

The protonic acid, which is allowed to exist as a catalyst in the hydrolysis of the metal alkoxide, is preferably hydrochloric acid, sulfuric acid, nitric acid or the like, and these protonic acids may be used alone or in a combination of two or more.

Preferred examples of the film-forming polymer material, which is added for the preparation of a sol-like ferroelectric precursor solution, include alkyl celluloses, hydroxyalkyl celluloses, polyethylene oxide, polyvinyl alcohol, polyvinyl butyral, polyvinyl pyrrolidone, and polyacrylic esters, and they may be used alone or in a combination of two or more.

The binder material added for the preparation of fine particles of a ferroelectric precursor may be the same as or different from the film-forming polymer material added in the previous step of preparing a sol-like ferroelectric precursor solution. Preferably, however, the binder material is the same as the film-forming polymer material, more preferably a vinyl polymer material, particularly preferably polyvinyl butyral.

The ferroelectric material for constituting the ferroelectric element of the present invention is not particularly limited so far as the conditions specified in the present invention are satisfied. Preferred examples thereof include ceramics having a perovskite structure with lead zirconate titanate (PZT), PLZT, PMN and the like being more preferred. Use of PZT is particularly advantageous for carrying out the present invention.

The ferroelectric element of the present invention may be provided in various forms. In general, however, it is preferably in the form of a thin film having a thickness of 10 to 20 $\mu$m.

According to another aspect of the present invention, there is provided a process for producing a ferroelectric element comprising a ferroelectric material containing at least two metals, comprising the steps of:

hydrolyzing alkoxides of the respective metals in the presence of a catalytic amount of a protonic acid to increase the molecular weight of the metal alkoxides;

adding a film-forming polymer material to the resultant sol-like solution; and treating the resultant sol-like ferroelectric precursor solution to prepare a desired ferroelectric element.

According to one preferred embodiment of the present invention, the process for producing a ferroelectric element further comprises, before the step of treating the sol-like ferroelectric precursor solution prepared in the step of increasing the molecular weight of the metal alkoxides, the step of adding a binder material, to the ferroelectric precursor solution, in an amount effective in accelerating the gelation to produce fine particles of the ferroelectric precursor in the solution.

As described above, the ferroelectric element produced according to the process of the present intention is preferably in a thin film form, and, therefore, preferably, the step of coating the sol-like ferroelectric precursor solution on a substrate and drying the coating is repeated to a predetermined coating thickness and the coating is finally fired to form a thin-film ferroelectric element. If necessary, the step of coating the sol-like ferroelectric precursor solution on a substrate and drying and firing the coating is repeated to form a thin-film ferroelectric element having increased thickness.

In the addition of the binder material to the sol-like ferroelectric precursor solution according to the present invention, the binder material is preferably added in an amount large enough to permit the sol-gel reaction to further proceed to produce fine particles of a ferroelectric precursor in the resultant sol-gel solution. The sol-gel solution may be then formed into a green sheet having a predetermined shape which is finally annealed to produce the ferroelectric element of the present invention.

According to another aspect of the present invention, there is provided an ink jet head comprising: a plurality of nozzles for ejecting an ink; an ink chamber, communicating with the nozzles, for permitting therein passage and pressurization of the ink; and pressurizing means for creating a change in volume of the ink in the ink chamber to eject the ink through the nozzle, wherein the pressurizing means comprises, as a piezoelectric element, a ferroelectric element comprising a ferroelectric material containing at least two metals, said ferroelectric element having been produced by a process comprising the steps of:

providing alkoxides of the respective metals as starting compounds; hydrolyzing the metal alkoxides in the presence of a catalytic amount of a protonic acid to increase the molecular weight of the metal alkoxides; and adding a film-forming polymer material to the sol-like solution prepared in the step of increasing the molecular weight to prepare a sol-like ferroelectric precursor solution.

Basically, the ink jet head of the present invention has the same construction as the piezoelectric ink jet head commonly used in the art and is not particularly limited so far as the described thin film of a ferroelectric is used as a piezoelectric element. Therefore, a suitable ink jet head is, for example, one which will be described below with reference to FIG. 5.

BEST MODE FOR CARRYING OUT THE INVENTION

The present invention will be described in more detail with reference to the following preferred embodiments. The ferroelectric element and the process for producing the same will be described with reference to a lead zirconate titanate (PZT) element, a typical example of a ferroelectric element. However, it should be noted that the present invention can be applied to any other ferroelectric material described above. An embodiment wherein the ferroelectric element of the present invention is used particularly as a piezoelectric element of a piezoelectric ink jet head will be described. However, it should be noted that the ferroelectric element can be advantageously applied to other devices.

Figure 1:
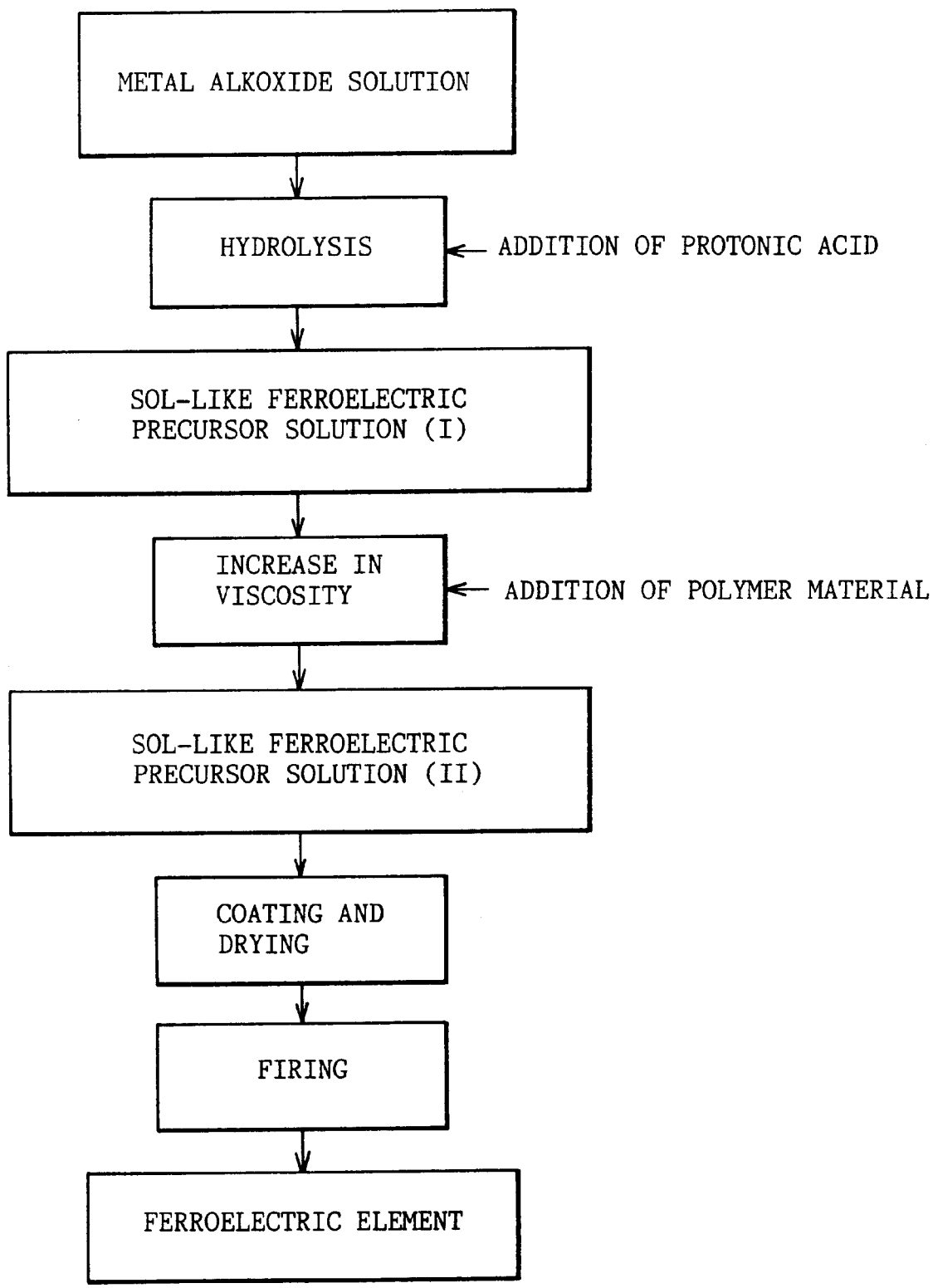
FIG. 1 is a flowchart showing one preferred embodiment of the process for producing a ferroelectric element according to the present invention.

Preferably, the formation of the ferroelectric element of the present invention can be carried out as sequentially shown in FIG. 1, that is, by preparing a metal alkoxide solution, adding a protonic acid as a catalyst to the solution, and hydrolyzing the metal alkoxide to increase the molecular weight. A sol-like ferroelectric precursor solution (I) is provided as a result of increasing the molecular weight. According to the present invention, increasing the molecular weight in this way enables the firing temperature in the step of firing as the final step to be lowered, leading to a reduction in internal stress causative of cracking.

Figure 4:
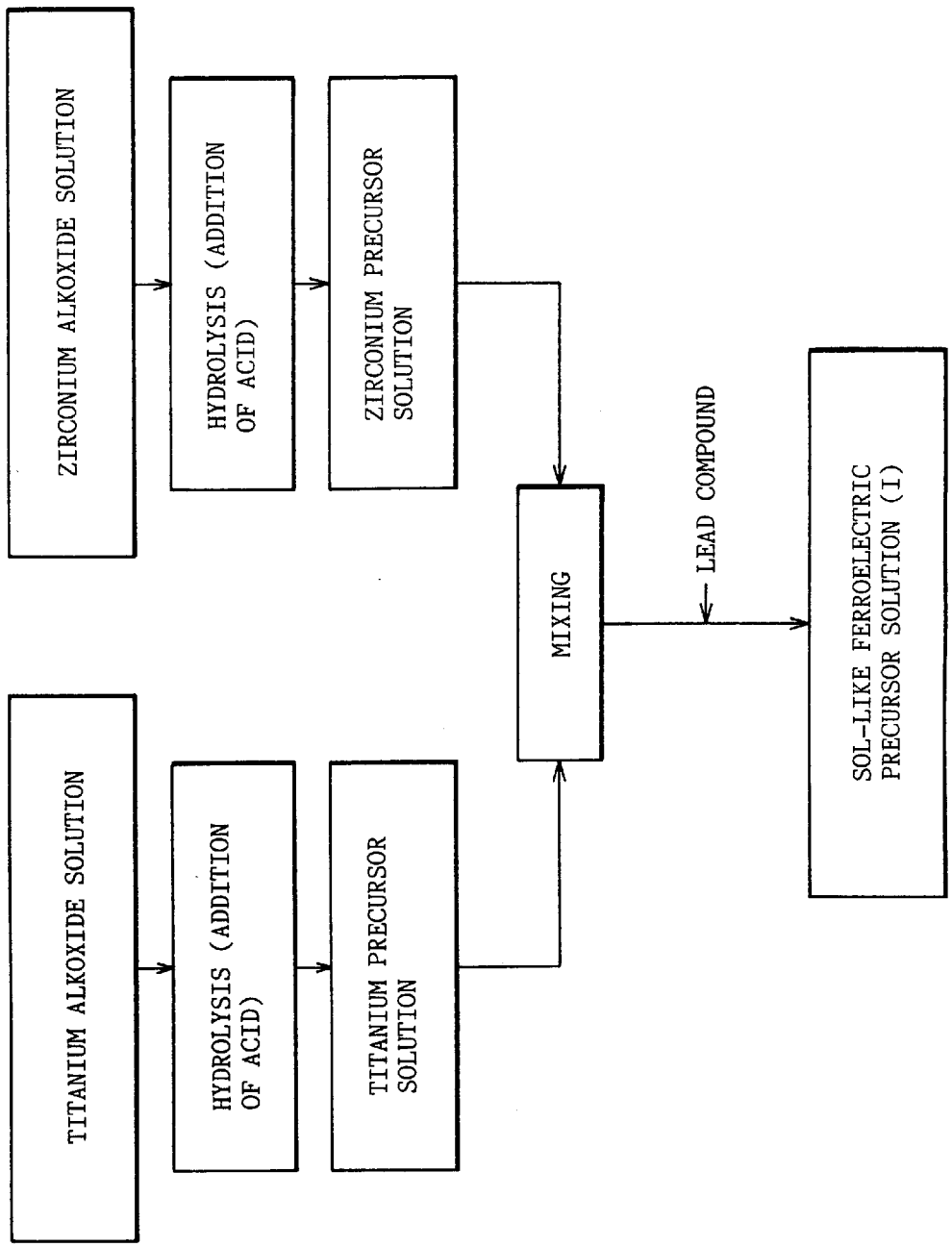
FIG. 4 is a flowchart showing a preferred process for preparing a sol-like ferroelectric precursor solution which can be advantageously used in the processes shown in FIGS. 1 to 3.

The preparation of a sol-like ferroelectric precursor solution (I) by hydrolysis of a metal alkoxide may be performed by various methods. For example, when the provision of a PZT element is contemplated, preferably, the preparation may be performed as shown in FIG. 4. Specifically, it is possible to use a method which comprises separately hydrolyzing a titanium alkoxide solution and a zirconium alkoxide solution, mixing the resultant titanium precursor solution and zirconium precursor solution together, and finally adding a lead compound to the mixture to prepare a sol-like ferroelectric precursor solution (I). Otherwise, although not shown, a method may be used which comprises separately hydrolyzing a titanium alkoxide solution and a zirconium alkoxide solution, adding a lead compound to the resultant titanium precursor solution and zirconium precursor solution, and mixing the resultant titanium lead precursor solution and the zirconium lead precursor solution together to prepare a sol-like ferroelectric precursor solution (I).

Subsequently, a film-forming polymer material is added to the sol-like ferroelectric precursor solution (I) to increase the viscosity. The sol-like ferroelectric precursor solution (II) thus prepared is a heterogeneous solution and contains a three-dimensionally crosslinked ferroelectric precursor. According to the present invention, the addition of the polymer material to modify the viscosity enables the film thickness to be increased to not less than 10 $\mu$m. This permits use of screen printing and good patterning using the screen printing. Further, the adhesion to the underlying substrate can be improved. The sol-like ferroelectric precursor solution (II) is then coated onto a substrate by a conventional method, and the coating is dried and fired. Preferably, the step of coating and drying is repeated a plurality of times to provide a desired film thickness. A contemplated ferroelectric element can be provided through the series of steps described above.

The formation of the PZT element according to the present invention will be described according to a process, shown in FIGS. 1 and 4, particularly with respect to an element in a thin film form. As can be understood, the present invention may be, if necessary, applied to the formation of elements other than the thin film.

Preparation of Sol-like PZT Precursor Solution (I)

Alkoxides of titanium, zirconium, and lead as starting compounds are hydrolyzed in the presence of a protonic acid as a catalyst to prepare a sol-like PZT precursorsolution (I). In this case, the alkoxide of titanium and zirconium may be the corresponding tetraethoxide, tetrapropoxide, tetrabutoxide and the like. If these alkoxides have isomers, the isomers may also be used. The metal alkoxides may be used alone or, if necessary, in a combination of two or more. For example, alkoxides of titanium usable herein include titanium tetraisopropoxide Ti(O-i-C$_3$H$_7$)$_4$, and alkoxides of zirconium usable herein include zirconium tetra-n-butoxide Zr(O-n-C$_4$H$_9$)$_4$. The alkoxide of lead may be the same as the alkoxide of titanium and zirconium. Alternatively, if necessary, use in the form of a carboxylic ester, such as acetate, is also possible. Preferably, these metal alkoxides are used as solutions thereof in organic solvents including alcohols. Suitable organic solvents include, but are not limited to, isopropanol, ethanol, methanol, propanol, butanol, and isobutanol.

The titanium alkoxide, zirconium alkoxide, and lead alkoxide are then hydrolyzed in the presence of a protonic acid. Preferably, the hydrolysis is carried out by using the protonic acid in the form of an aqueous solution, that is, by treating the resultant alkoxide with an acidic aqueous solution. Suitable protonic acids usable herein include, for example, hydrochloric acid, sulfuric acid, and nitric acid. These protonic acids may be used alone or, if necessary, in a combination of two or more acids. The concentration of the protonic acid may be widely varied so far as it is useful as a catalyst. It is, however, preferably about 0.001 normal. The acidic aqueous solution is preferably used as a solution thereof in the same organic solvent as used in the preparation of the alkoxide solution. If necessary, however, it may be used as a solution thereof in other organic solvent. These protonic acids function not only to hydrolyze the alkoxide of titanium and zirconium but also as a catalyst, which causes a polycondensation reaction by a dehydration reaction, for increasing the molecular weight of the hydroxide of titanium or zirconium.

Specifically, at the outset, the titanium alkoxide solution and the zirconium alkoxide solution are hydrolyzed with the above acidic aqueous solution to prepare a corresponding titanium precursor solution and a zirconium precursor solution. These precursor solutions are then mixed together to prepare a homogeneous solution, and a lead compound, for example, a diethoxy lead is added to the solution, followed by mixing. Thus, a homogeneous sol-like PZT precursor solution (I) is prepared. In this case, the concentration of the PZT precursor solution (I) is not particularly limited and may be widely varied depending upon desired results, film forming conditions, and other various conditions. According to the finding of the present inventors, the concentration of PZT in the PZT precursor solution is preferably about 5 to 20% by weight, more preferably about 10% by weight. Thus, the series of steps shown in FIG. 4 is completed. Thereafter, the preparation of a sol-like PZT precursor solution (II) and the formation of a thin film element of PZT (see FIG. 1) are performed.

Preparation of Sol-like PZT Precursor Solution (II)

A film-forming polymer material is added to the PZT precursor solution (I) prepared above to increase the viscosity. Polymer materials usable herein include those which can function as a thickening agent and optionally as a binder. Further, as described above, they are particularly effective in increasing the film thickness to not less than 10 μm. Suitable polymer materials include naturally occurring and synthetic vinyl or cellulosic polymer materials. In this case, they should satisfy the following requirements: they should be soluble in an organic solvent as a main solvent of the PZT precursor solution (I) prepared above and have a film-forming property; and at the time of the formation of a thin film of PZT (that is, when firing is carried out), when the temperature thereof exceeds a predetermined temperature, they should be thermally decomposable and hence will not remain in the resultant PZT crystal. Examples of polymer materials, which may be advantageously used, include, but are not limited to, alkyl celluloses and hydroxyalkyl celluloses, preferably those with the alkyl having 2 to 4 carbon atoms (for example, ethyl cellulose and hydroxypropyl cellulose), polyethylene oxide, polyvinyl alcohol, polyvinyl butyral, polyvinyl pyrrolidone, and polyacrylic esters. These polymer materials may be used alone or in a combination of two or more. The amount of the polymer material added may be widely varied depending upon factors such as desired effect. Further, in fact, the regulation of the amount of the polymer material added to increase the viscosity and the formation of a film, followed by firing of the film can provide a thick film having a thickness of not less than 10 μm. The amount of the polymer material added is generally about 0.1 to 50% by weight based on the total amount of the PZT precursor solution (I). Preferably, when the thickening agent used is hydroxypropyl cellulose, it is generally added in an amount of about 0.5 to 10% by weight based on the total amount of the PZT precursor solution (I).

Further, according to the findings of the present inventors, associated with an increase in the viscosity of the PZT precursor solution (I) and an increase in film thickness attained thereby, when the viscosity of the precursor solution is about 30 cps, the film thickness is about 40 nm; when the viscosity of the precursor solution is about 200 cps, the film thickness is about 1 μm; and when the viscosity of the precursor solution is about 500 cps, the film thickness is about 10 μm. In the case of a film thickness of about 10 to 20 μm, which is the desired film thickness, the number of repetitions of the step of coating may be varied depending upon the viscosity of the PZT precursor solution (I) to provide the thick film. For example, when the viscosity of the precursor solution is about 200 cps, the repetition of the coating of the solution ten times can provide a film thickness of 10 to 20 μm. When the viscosity is about 500 cps, the coating of the solution once or twice can provide the same film thickness. However, when the number of repetitions of the coating of the precursor solution exceeds 10, that is, when the number of layers constituting the PZT thin film forming coating is 10 or more, the force on the underlying substrate to bind the coating is lowered. As a result, cracking is likely to occur due to the internal stress of the film per se. Further, the adhesion of the film to the substrate is lowered, and the time taken and the cost for the coating are increased. For the above reason, the number of repetitions of the coating is preferably smaller than that in the usual case.

The above polymer material may be added in various forms to the PZT precursor solution (I). For example, the selected precursor solution as such may be added directly to the precursor solution. Alternatively, the polymer material may be previously added to the solvent (for example, isopropanol), for the PZT precursor, to prepare a homogeneous polymer material solution, followed by addition of the solution to the PZT precursor. Otherwise, it is also possible to use a method wherein, after the addition of the polymer material to another solvent (for example, butanol) soluble in the solvent, for the PZT precursor, to prepare a homogeneous polymer material solution, the polymer material solution is added to the PZT precursor.

After the completion of the addition of the polymer material for increasing the viscosity, mixing is well performed with agitation. Any agitating and mixing device may be used for the mixing. The mixing results in the preparation of a coating solution for the formation of a thin film of PZT. A homogeneous paste, which can be coated by screen printing or the like, can be prepared by placing the mixture in a milling device, for example, a planetary ball mill, and milling the mixture for several min. Preferably, after vacuum deaeration for several min by means of a rotary pump, the paste is coated.

Coating (formation of film)

The coating solution or the paste prepared above is coated on a predetermined substrate to form a desired pattern of film. The coating may be performed by a conventional method, and examples of coating methods usable herein include doctor blading, roll coating, bar coating, spin coating, dip coating, and screen coating. The optimal coating method may be selected according to the contemplated thin film of PZT. Likewise, the coverage, that is, the thickness of the film formed may be suitably selected according to various factors. For example, a submicron film thickness after drying suffices for use of the resultant thin film of PZT as a memory, a capacitor and the like. On the other hand, when use of the thin film of PZT as an actuator is contemplated, the film thickness on the order of several tens of μm is preferred. Preferably, the coating is repeated to provide desired thickness. In particular, repetition of the coating in combination with the subsequent step of drying and optionally the step of firing is preferred.

Drying

Subsequently, the film thus formed is dried to assist in curing and, at the same time, to remove excess water or the like by evaporation. The drying temperature and time may be widely varied. In general, however, the drying is performed at about 100 to 250° C. for about 5 to 90 min. For example, drying at 150° C. for 10 min may be adopted. The step of degreasing and other conventional treatment steps (not shown in FIG. 1) may be interposed between the step of drying and the step of firing.

Firing

Finally, the dried coating is fired. As with the step of drying described above, the step of firing may be carried out by any method commonly used in the art. The firing temperature is preferably about 500 to 900° C., more preferably about 700 to 800° C. In general, firing at about 500° C. can offer the desired results. The firing time may be widely varied according to the relationship thereof with the firing temperature or the like. In general, however, it is in the range of about 1 to 60 min. A thin film of PZT, which has a thickness of not less than 10 μm, has high density and high compactness and is free from cracking, is formed as a result of the annealing. The composition (Pb:Zr:Ti:O ratio) of the thin film of PZT thus formed is the same as that of the initially prepared PZT precursor solution (I).

In the formation of the above thin film of PZT, the Pb:Zr:Ti:O ratio in the PZT precursor solution (I) may be widely varied according to the desired results. In order to provide the best piezoelectric properties, as described above, it is recommended that Pb:Zr:Ti:O be 1:0.53:0.47:3. In the present invention, when the above composition ratio is adopted in the PZT precursor, the ratio may be reproduced as it is in the thin film of PZT, enabling a thin film of PZT, which is homogeneous, has high density and possesses excellent piezoelectric properties, to be easily provided.

As described above, the thin film of PZT according to the present invention is formed through the step of preparing a sol-like PZT precursor solution (II). In one variant of the step of preparing the sol-like PZT precursor solution (II), according to the present invention, the sol-like PZT precursor solution (II) may further comprise fine particles of PZT precursor produced in situ in the course of the sol-like PZT precursor solution (II).

Figure 2:
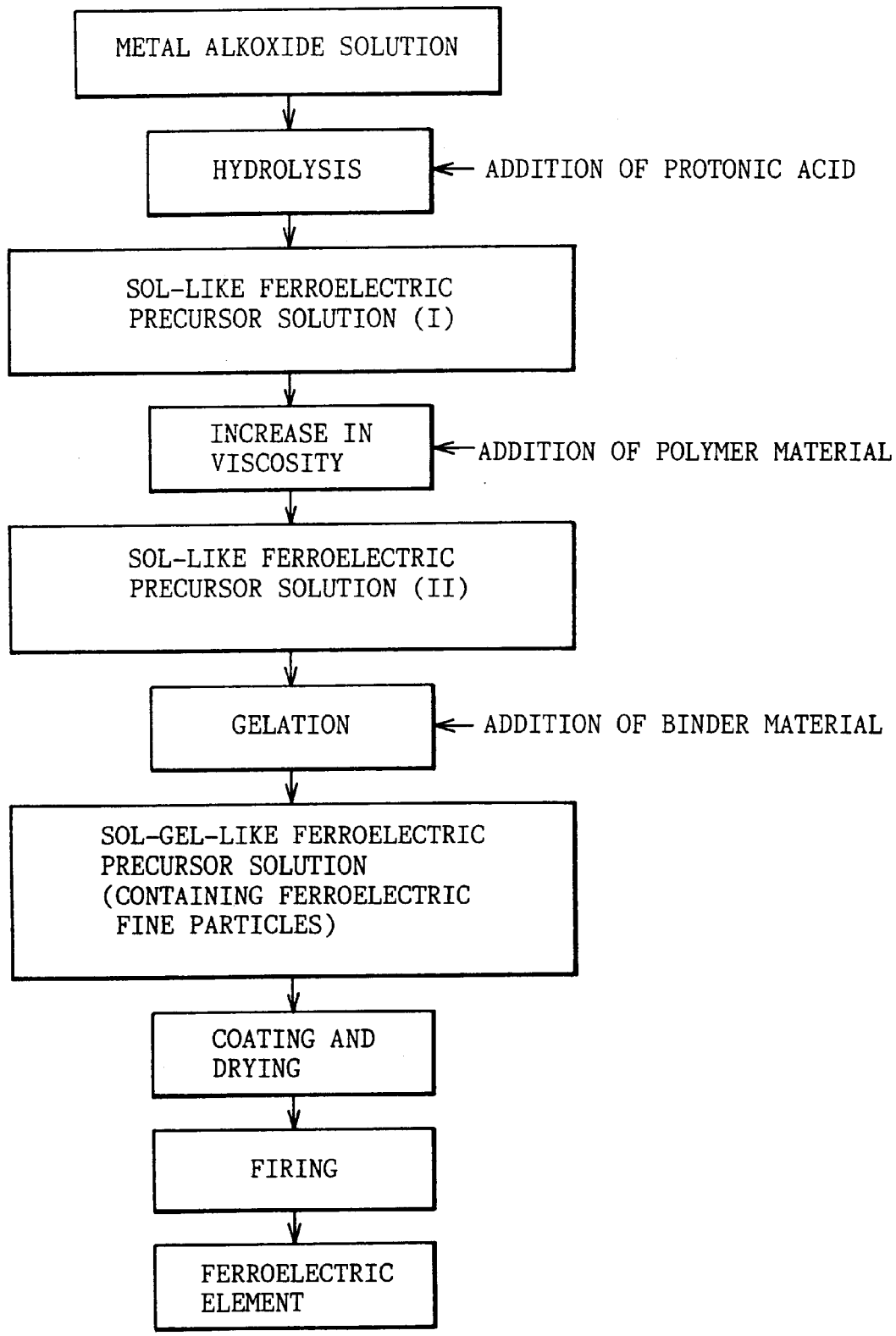
FIG. 2 is a flowchart showing another preferred embodiment of the process for producing a ferroelectric element according to the present invention.

The sol-like PZT precursor solution (II) containing fine particles of the PZT precursor is particularly called "sol-gel-like precursor solution" in the present specification and, as shown in FIG. 2, may be prepared by adding a binder material to the sol-like PZT precursor solution (II) to induce gelation. FIG. 2 generally illustrates the formation of a ferroelectric element in sequence and teaches the step of adding a binder material, to the ferroelectric precursor solution (II), in an amount large enough to accelerate the gelation, before the sol-like ferroelectric precursor solution (II) is subjected to the subsequent step of coating and drying, thereby producing fine particles of a ferroelectric precursor in situ in the resultant sol-gel ferroelectric precursor. Further, if the film-forming polymer material added to increase the viscosity to prepare the sol-like PZT precursor solution (II) could exhibit a function which is the same as or equivalent to that for accelerating the gelation, the sol-gel-like ferroelectric precursor solution (containing fine particles of a ferroelectric) may be prepared as an extension of the previous step, that is, the step of "increasing the viscosity" without intentionally providing the step of "gelation" (not shown).

According to this preferred variant of the present invention, addition of a certain specific binder material to a sol-like PZT precursor solution (II) permits a sol-gel reaction to further proceed, and, as a result of a change in solubility of the PZT precursor, fine particles of the PZT precursor can be produced in situ in the sol-gel solution. The diameter of the fine particles of the resultant PZT precursor can be controlled by varying the molecular weight and amount of the binder material added or the weight concentration of the metal in the PZT at the time of addition of the binder material. Further, since the diameter of the fine particles of the PZT precursor is considerably small, utilization of the surface activity of the fine particles can lower the annealing temperature in the subsequent step of annealing. Thus, preparation of a PZT precursor solution, which appears as if fine particles of PZT have been externally added, can omit the time necessary for the preparation of the fine particles, and, in addition, the produced fine particles can be homogeneously dispersed in the PZT precursor solution. In particular, this method can eliminate the need to provide the step of dispersion. The thin film of PZT prepared from the PZT precursor solution, by virtue of the system wherein the fine particles have been produced in situ, is more dense than the thin film prepared using a system wherein fine particles are externally added.

The fine particles of PZT produced herein have an identical or similar crystal structure as the finally formed thin film of PZT, and, therefore, various noteworthy functions can be simultaneously exhibited. For example, the fine particles of PZT, when the PZT coating after drying is fired, can reduce the shrinkage of the coating by the volume of the produced fine particles, thus preventing cracking. Further, the production of fine particles of PZT can increase the coverage of PZT per unit coating, enabling the thickness of the thin film of PZT to be increased. The amount of the fine particles of PZT produced may be widely varied depending upon factors, such as conditions for the addition of the binder material. In general, however, it should be in the range of from about 5 to 20% by weight based on the total amount of the sol-gel-like PZT precursor solution.

Further, the binder material, added for producing the fine particles of PZT, per se can function effectively. For example, the binder material can control the viscosity of the PZT precursor solution or the paste of the PZT precursor and hence can control the thickness of the resultant thin film of PZT. Addition of the binder material followed by an agitating operation, such as milling, permits homogeneous dispersion of the resultant fine particles of PZT and can effectively prevent fine particles of PZT from settling. Further, the addition of the binder material can improve the wettability of the substrate by the PZT paste and the adhesion of the thin film of PZT, after annealing, to the substrate.

The binder material, which can be advantageously used in the step of producing fine particles of PZT, is not particularly limited so far as the desired function can be provided. Preferred vinyl polymer materials include, for example, polyvinyl butyral and polyvinyl ethylal. If possible, the polymer material added in the previous step, that is, the step of increasing the viscosity, may be added instead of or in combination with the above vinyl polymer material. The amount of the binder material and, if necessary, the polymer material added may be widely varied depending upon factors such as the desired amount of production of the fine particles of PZT. In general, however, it is in the range of from about 40 to 60% by weight based on the total amount of the sol-gel-like PZT precursor solution.

After the sol-gel-like PZT precursor solution containing fine particles of PZT has been prepared, the coating of the precursor solution and the drying and firing of the coating can be performed in the same manner as described above.

Figure 3:
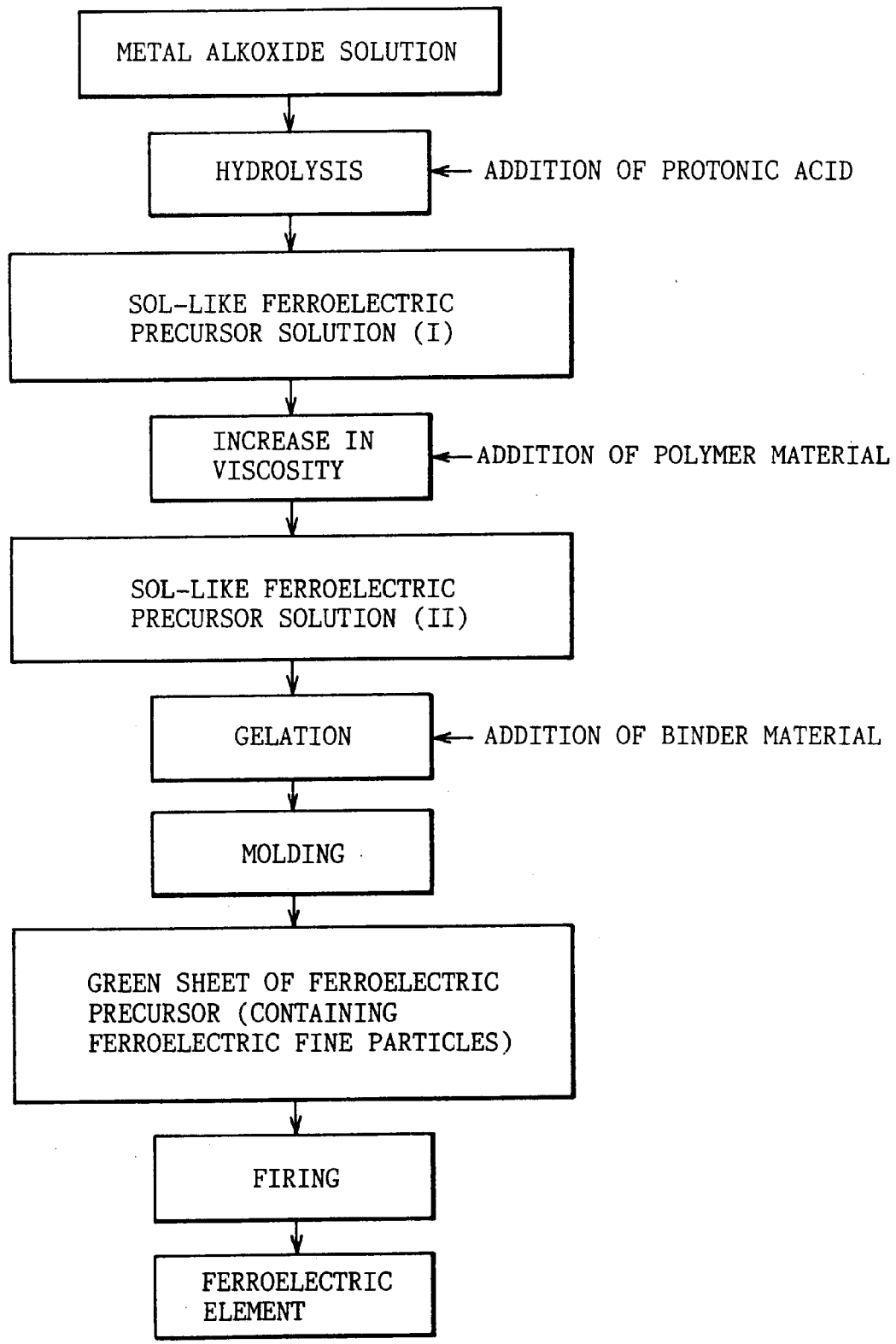
FIG. 3 is a flowchart showing still another preferred embodiment of the process for producing a ferroelectric element according to the present invention.

In addition to the above-described variant process of the present invention involving the production of fine particles of a PZT precursor, another preferred variant process involving the formation of a green sheet may be used for the formation of the PZT element according to the present invention. According to the present invention, the green sheet can be formed, for example, as shown in sequence in FIG. 3, by adding a binder material (as described above), to the sol-like PZT precursor solution (II), in an amount large enough to permit the sol-gel reaction to further proceed to produce fine particles of a PZT precursor in situ in the resultant sol-gel solution and then forming the sol-gel solution into a predetermined shape. The green sheet contains, in a dispersed state, the fine particles of the PZT precursor produced in the course of the formation of the sol-gel solution. Subsequent firing of the green sheet can provide a desired PZT element. In FIG. 3, as with FIG. 2, PZT is generally described as "Ferroelectric Element."

In the formation of the above green sheet, the binder material to be added to the sol-like PZT precursor solution (II) may be the same as the above binder material, except that the amount thereof added is generally increased. Further, in the forming of the green sheet, the method generally used for this purpose may be used as such or after modification. Suitable methods include, for example, doctor blading, screen printing, roll coating, and dip coating. The dimensions of the green sheet may be widely varied, in any thickness, from large to small. In general, the thickness of the green sheet is about 50 $\mu$m or more, and the size of the green sheet may be widely varied depending upon various shapes. The green sheet may be punched into a desired shape.

Use of the green sheet prepared according to the present invention in the formation of a ferroelectric element can lower the firing temperature for developing ferroelectricity and piezoelectricity by about 400° C. as compared with the prior art, permits the composition ratio to be easily controlled, and can broaden the range of selection of an electrode material for covering both ends of the green sheet for inducing ferroelectricity and piezoelectricity.

The piezoelectric element according to the present invention can be advantageously used for constituting pressing means particularly in a piezoelectric ink jet head, that is, an ink jet head comprising: a plurality of nozzles for ejecting an ink; an ink chamber, communicating with the nozzles, for permitting therein passage and pressurization of the ink; and pressurizing means for creating a change in volume of the ink in the ink chamber to eject the ink through the nozzle.

As described above, the ink jet head per se can have the same construction as the piezoelectric ink jet head commonly used in the art. The ink jet head of the present invention will be described with reference to FIG. 5.

An ink chamber 12 in an ink jet head 10 is provided in a predetermined pattern in an ink chamber member 11. The ink chamber member 11 may be made of various materials according to factors such as the method for forming the ink chamber 12. One embodiment of the ink chamber member 11 will be described. For example, glass, a plastic material, for example, a polyester resin (such as PET), an acrylic resin (such as PMMA), quartz, or other substrate is provided, and a resin material may be then patterned onto the substrate by photolithography or other method to form a groove corresponding to the ink chamber. Alternatively, the ink chamber member 11 may be formed by laser beam machining of a plastic material using an excimer laser or the like.

In the ink chamber member 11 shown in the drawing, a diaphragm 15 for creating a change in volume of the ink chamber 12 (one constituent element of pressurizing means referred to in the present invention) is provided on the open face of the ink chamber 12. The diaphragm 15 may be integrally molded with the ink chamber member 11 at the time of formation of the ink chamber member 11. Otherwise, it may be bonded to the ink chamber member 11 with the aid of an adhesive. Suitable materials for the diaphragm 15 include, for example, ceramics having high rigidity, for example, $ZrO_2$. The remaining elements of the pressurizing means are attached so as to abut against the diaphragm 15.

In the case of the embodiment shown in the drawing, the remaining elements of the pressurizing means are a piezoelectric element 17 as a driver for distorting the diaphragm 15 and an upper electrode 16 and a lower electrode 18 which sandwich the piezoelectric element 17 therebetween and, if necessary, can apply a voltage. The piezoelectric element 17 may be formed by the above process according to the present invention. The electrodes 16 and 18 each may be formed in a desired pattern by a conventional method, for example, sputtering, screen printing, or vapor deposition.

The ink jet head shown in the drawing may be operated as follows. An ink is fed into the ink chamber 12 through an ink feed port (not shown) of the head 10 to fill the ink chamber 12 with the ink. In this state, application of a voltage across the electrodes 16 and 18 creates displacement of the piezoelectric element 17 sandwiched between these electrodes due to the piezoelectric properties, permitting the diaphragm 15 disposed so as to abut against the piezoelectric element 17 to be pushed out towards the ink chamber 12. This reduces the volume of the ink filled in the ink chamber 12, leading to dotwise ejection of the ink in an amount corresponding to the reduction of the volume through a nozzle (not shown) communicating with the ink chamber 12.

EXAMPLES

The present invention will be described in more detail with reference to the following examples. It should be understood that the present invention is not limited to these examples.

Example 1

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze the titanium tetraisopropoxide. After the mixture was refluxed at a temperature of 82.4° C., the boiling point of isopropanol, for 8 hr, 0.0188 mol of ethoxyethanol was added thereto. Thus, a titanium precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in increased molecular weight of the zirconium tetra-n-butoxide. Thus, a zirconium precursor solution was prepared.

The titanium precursor solution and the zirconium precursor solution, which had been prepared separately from each other, were mixed together, and the reflux was continued for additional 0.5 hr. 5.94 g (0.02 mol) of diethoxylead was added to the mixture, and the mixture was refluxed at 82.4° C. for 0.5 hr. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has been taken into consideration, and the preparation and mixing were performed so that the finally formed thin film of PZT had a desired composition ratio (Pb:Zr:Ti:O=1:0.53:0.47:3).

After the preparation of the PZT precursor solution (I), 0.65 g of hydroxypropyl cellulose was added to the precursor solution, to increase the viscosity, and the mixture was thoroughly stirred at room temperature. Thus, a homogeneous PZT precursor coating solution was prepared.

The PZT precursor coating solution was dip-coated onto a quartz substrate, and the coating was dried at 100° C. for 10 min and then fired in the atmosphere at 600° C. for 15 min. Thus, a 1.5 $\mu$m-thick even thin film of PZT free from cracking was prepared.

Further, the step of dip-coating the PZT precursor coating solution onto the quartz substrate and drying the coating at 100° C. for 10 min was repeated six times. Thereafter, the coating was fired in the atmosphere at 600° C. for 15 min, and a 10 $\mu$m-thick even thin film of PZT free from cracking was prepared.

Example 2

Figure 5:
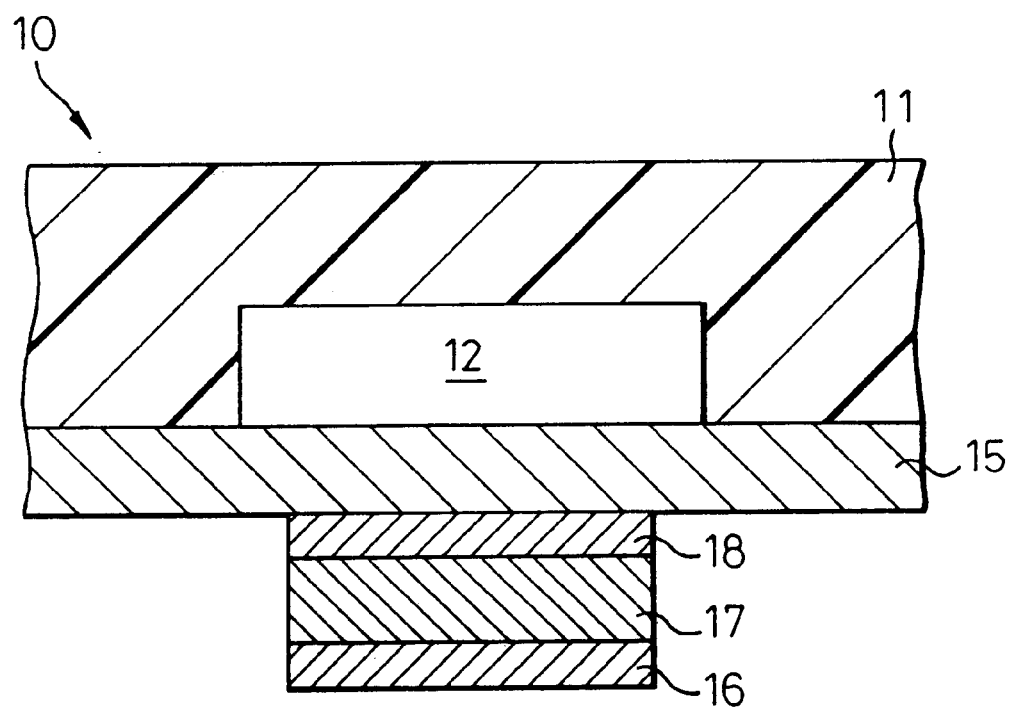
FIG. 5 is a cross-sectional view showing a principal part of a piezoelectric ink jet head according to one preferred embodiment of the present invention.

A thin film of PZT was formed from the PZT precursor coating solution prepared in Example 1, and the thin film of PZT was incorporated into a piezoelectric ink jet head having a structure shown in FIG. 5.

A diaphragm of a thin ceramic sheet was prepared, and a platinum electrode was formed in its predetermined area by sputtering. Further, the PZT precursor coating solution prepared in Example 1 was spin-coated at 2000 rpm onto the platinum electrode. The thin film of PZT on the platinum electrode was dried at 100° C. for 10 min and further fired at 600° C. for 15 min. As a result of the firing, the crystallization of PZT proceeded. Thus, a thin film of PZT having a perovskite structure was formed. This thin film of PZT had good adhesion to the platinum electrode and the diaphragm and further exhibited satisfactory adhesion in the sputtering of an additional platinum electrode on the thin film of PZT. Further, since a relatively low temperature can be applied to the firing of the thin film of PZT, the range of selection of the diaphragm as the substrate can be broadened.

Example 3

The procedure of Example 2 was repeated, except that, in the preparation of the PZT precursor solution (I) according to the procedure of Example 1, instead of hydrochloric acid, 0.001 N sulfuric acid was used as the protonic acid catalyst in the same amount as the hydrochloric acid. The properties of the thin film of PZT thus prepared were satisfactory and comparable with those of the thin film of PZT prepared in Example 2.

Example 4

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze titanium tetraisopropoxide. After the mixture was refluxed for 8 hr, 0.0188 mol of ethoxyethanol was added thereto, followed by reflux for 30 min. The ref lux temperature was 82.4° C., the boiling point of isopropanol. 2.79 g (0.0094 mol) of diethoxylead was added to the titanium precursor solution, and the reflux was continued for additional 30 min. Thus, a titanium lead precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in increased molecular weight of the zirconium tetra-n-butoxide. Thus, a zirconium precursor solution was prepared. 3.15 g (0.0106 mol) of diethoxylead was dded to the zirconium precursor solution, and the eflux was continued for additional 30 min. Thus a irconium lead precursor solution was prepared.

The titanium lead precursor solution and the zirconium lead precursor solution, which had been prepared separately from each other, were mixed together, and the reflux was continued at 82.4° C. for 30 min. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has been taken into consideration, and the preparation and mixing were performed so that the finally formed thin film of PZT had a desired composition ratio (Pb:Zr:Ti:O= 1:0.53:0.47:3).

After the preparation of the PZT precursor solution (I), 0.65 g of hydroxypropyl cellulose was added to the precursor solution to increase the viscosity, and the mixture was thoroughly stirred at room temperature. Thus, a homogeneous PZT precursor coating solution was prepared.

The PZT precursor coating solution was then dip-coated onto a quartz substrate, and the coating was dried at 100° C. for 10 min and then fired in the atmosphere at 600° C. for 15 min. Thus, a 1.5 µm-thick even thin film of PZT free from cracking was prepared.

Further, the step of dip-coating the PZT precursor coating solution onto the quartz substrate and drying the coating at 100° C. for 10 min was repeated six times. Thereafter, the coating was fired in the atmosphere at 600° C. for 15 min, and a 10 µm-thick even thin film of PZT free from cracking was prepared.

Example 5

A thin film of PZT was formed from the PZT precursor coating solution prepared in Example 4, and the thin film of PZT was incorporated into a piezoelectric ink jet head having a structure shown in FIG. 5.

A diaphragm of a thin ceramic sheet was prepared, and a platinum electrode was formed in its predetermined area by sputtering. Further, the PZT precursor coating solution prepared in Example 4 was spin-coated at 2000 rpm onto the platinum electrode. The thin film of PZT on the platinum electrode was dried at 100° C. for 10 min and further fired at 600° C. for 15 min. As a result of the firing, the crystallization of PZT proceeded. Thus, a thin film of PZT having a perovskite structure was formed. This thin film of PZT had good adhesion to the platinum electrode and the diaphragm and further exhibited satisfactory adhesion in the sputtering of an additional platinum electrode on the thin film of PZT. Further, since a relatively low temperature can be applied to the firing of the thin film of PZT, the range of selection of the underlying diaphragm can be broadened.

Example 6

The procedure of Example 1 was repeated, except that, in the preparation of the PZT precursor coating solution according to the procedure of Example 1, polyvinyl butyral was added instead of hydroxypropyl cellulose in order to increase the viscosity. Specifically, a PZT precursor solution (I) was prepared according to the procedure of Example 1. Isopropanol was removed from the precursor solution by distillation under reduced pressure to bring the concentration of isopropanol in terms of PZT to 40%. In order to increase the viscosity of the PZT precursor solution (I), 16.3 g of a solution of 25% polyvinyl butyral in butanol was added to the precursor solution, and the mixture was thoroughly stirred at room temperature. Thus, a homogeneous PZT precursor coating solution was prepared.

The PZT precursor coating solution thus prepared was coated onto a quartz substrate by a bar coater, and the coating was dried at 100° C. for 30 min and fired in the atmosphere at 600° C. for 30 min. Thus, a 6 µm-thick even thin film of PZT free from cracking was prepared.

Further, the step of bar-coating the PZT precursor coating solution onto the quartz substrate and drying the coating at 100° C. for 30 min was repeated twice. Thereafter, the coating was fired in the atmosphere air at 600° C. for 30 min, and a 12 µm-thick even thin film of PZT free from cracking was prepared.

Example 7

The procedure of Example 6 was repeated, except that 40.75 g of a solution of 20% polyvinyl butyral in butanol was added to the PZT precursor solution (I).

The PZT precursor coating solution was then coated onto a quartz substrate by a bar coater, and the coating was dried at 100° C. for 30 min and then fired in the atmosphere at 600° C. for 30 min. Thus, a 5 µm-thick even thin film of PZT free from cracking was prepared.

Further, the step of bar-coating the PZT precursor coating solution onto the quartz substrate and drying the coating at 100° C. for 30 min was repeated twice. Thereafter, the coating was fired in the atmosphere at 600° C. for 30 min, and a 10 µm-thick even thin film of PZT free from cracking was prepared.

Examples 8 to 10

The procedure of Example 1 was repeated, except that, in the preparation of the PZT precursor coating solution according to the procedure of Example 1, ethyl cellulose (Example 8), polyvinyl alcohol (Example 9), and polyvinyl pyrrolidone (Example 10) were used, instead of hydroxypropyl cellulose, in an amount corresponding to the amount of hydroxypropyl cellulose, in order to increase the viscosity. For all the examples, the properties of the thin films of PZT were satisfactory and comparable with those of the thin film of PZT prepared in Example 1.

As can be understood from the results described in Examples 1 to 10, according to the present invention, utilization of a titanium precursor solution and a zirconium precursor solution, the molecular weights of which have been increased using an acid catalyst, in the formation of a thin film of PZT is greatly involved in the prevention of cracking in the thin film of PZT. Further, the regulation of the concentration of the polymer materials added in order to increase the viscosity, such as hydroxypropyl cellulose and polyvinyl butyral, enables the thickness of the thin film formed by one coating step to be regulated.

Example 11

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze titanium tetraisopropoxide. After the mixture was refluxed for 8 hr at 82.4° C., the boiling point of isopropanol, 0.0188 mol of ethoxyethanol was added thereto. Thus, a titanium precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in increased molecular weight of the zirconium tetra-nbutoxide. Thus, a zirconium precursor solution was prepared.

The titanium precursor solution and the zirconium precursor solution, which had been prepared separately from each other, were mixed together, and the reflux was continued for 0.5 hr. 5.94 g (0.02 mol) of diethoxylead was added to the mixture, and the mixture was refluxed at 82.4° C. for 0.5 hr. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has been taken into consideration, and the preparation and mixing were performed so that the finally formed thin film of PZT had a desired composition ratio (Pb:Zr:Ti:O=1:0.53:0.47:3).

After the preparation of the PZT precursor solution (I), a butanol solution of polyvinyl butyral (PVB, weight average molecular weight=300) was added to the precursor solution in order to increase the viscosity and to perform subsequent gelation, and the mixture was thoroughly stirred at room temperature. The butanol solution of PVB used herein was prepared by dissolving PVB in butanol to a concentration of 25%, and the amount of the butanol solution added was 40% based on the molar concentration of the metal in the PZT precursor solution (I).

Addition of the butanol solution of PVB to the PZT precursor solution (I) followed by stirring permitted PVB to be coordinated to PZT, developing the function of strengthening the network of PZT in the precursor solution. Further, coordination of PVB resulted in a change in solubility of PZT and initiation of precipitation and agglomeration of PZT depending upon the molecular weight of PVB and the amount of the solvent in the system. This led to initiation of the growth of the contemplated fine particles of PZT. Thus, the PZT precursor solution (I) contained fine particles of PZT in the solution per se and was converted to a sol-gel-like PZT precursor solution with fine particles being bonded to one another through PVB as the binder and the PZT precursor remaining unagglomerated. A sol-gel-like PZT precursor coating solution containing homogeneously dispersed fine particles of PZT was thus prepared.

Subsequently, in order to form a thin film of PZT, a platinum electrode was formed by sputtering on a quartz substrate in its predetermined area. The PZT precursor coating solution containing fine particles of PZT was coated onto the platinum electrode by means of a bar coater, and the coating was dried at 150° C. for 10 min. Thereafter, the coating was prefired at 500° C. for one hr in order to decompose and remove the previously added PVB and finally was fired at 650° C. for one hr. As a result of the firing, the crystallization of PZT proceeded to provide a thin film of PZT having a perovskite structure. The thickness of the thin film of PZT was 10 µm. This thin film of PZT had good adhesion to the platinum electrode and the underlying quartz substrate and further exhibited satisfactory adhesion in the sputtering of an additional platinum electrode on the thin film of PZT. Further, since a relatively low temperature can be applied to the firing of the thin film of PZT, the range of selection of the underlying diaphragm in a piezoelectric ink jet head can be broadened.

The state of fine particles of PZT in the thus formed thin film of PZT was observed in a reflection electron microphotograph. As a result, it was found that PZT had an even film thickness and PZT particles, which were fine and had even diameter, were densely distributed without creating any defect, such as cracking, in the whole film.

Example 12

The procedure of Example 11 was repeated, except that, in order to evaluate the influence of PVB as a binder on the formation of fine particles of PZT in situ, an evaluation test was carried out under the following conditions.

Figure 6:
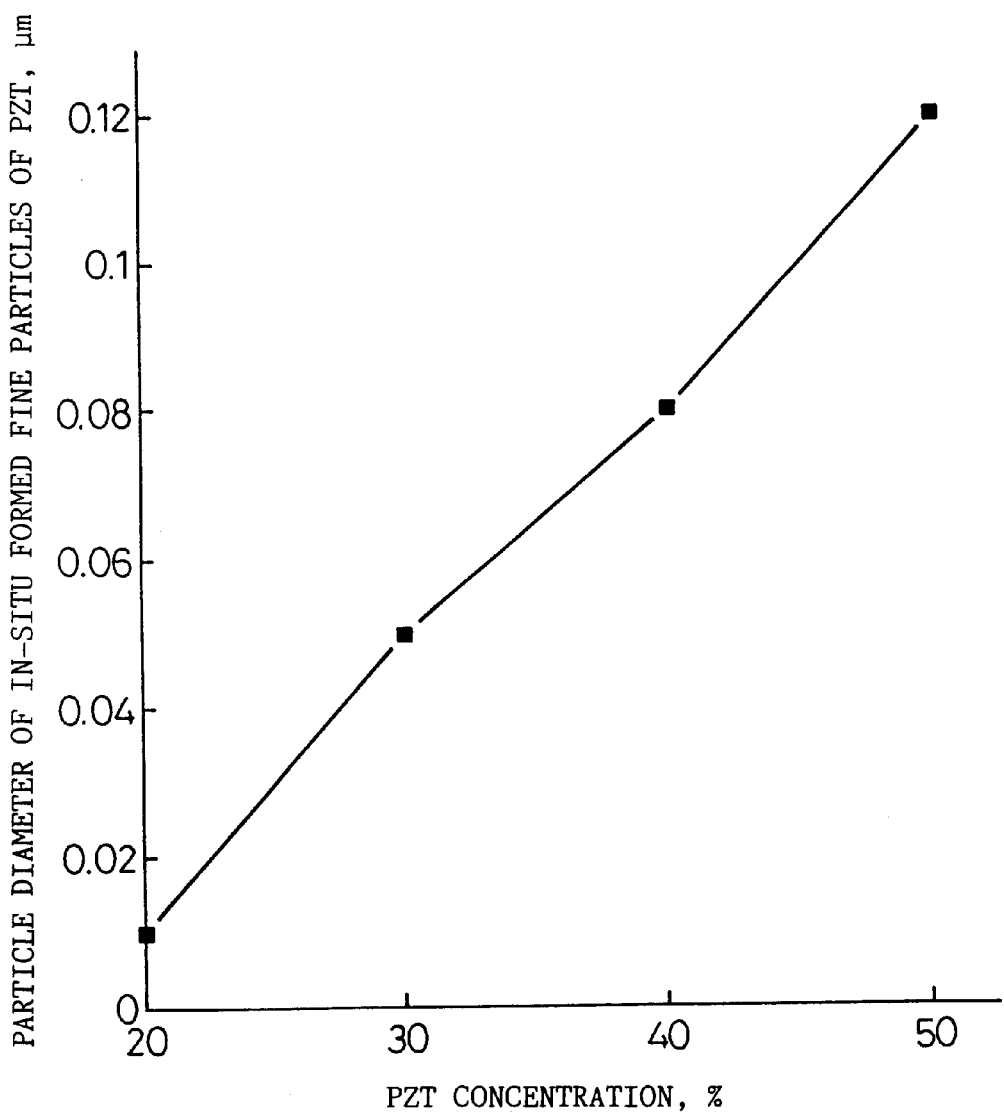
FIG. 6 is a graph showing the influence of the concentration of PZT in a PZT precursor solution on the diameter of in-situ formed fine particles of PZT.

(1) A change in diameter of fine particles of PZT formed in situ in the thin film of PZT as a function of the weight concentration of a metal After the preparation of the PZT precursor solution (I), a 25% butanol solution of PVB (weight average molecular weight=300) was added to the solution. The amount of the butanol solution of PVB added was 20%, 30%, 40% (same as the concentration in Example 11), and 50% based on the weight concentration of the metal in the PZT precursor solution (I). The ratio of PZT to PVB was 1.5:5. As a result of the evaluation test, it was found that, as can be understood from the results plotted in FIG. 6, the concentration of fine particles of PZT formed in situ increased with an increase in the weight concentration of the metal in the PZT precursor solution, that is, PZT concentration. According to the findings of the present inventors, a weight concentration of the metal in the PZT precursor solution of about 20 to 40% is generally suitable.

(2) A change in diameter of fine particles of PZT formed in situ in the thin film of PZT as a function of the weight average molecular weight of PVB in a 25% butanol solution of PVB added to the PZT precursor solution (I)

Figure 7:
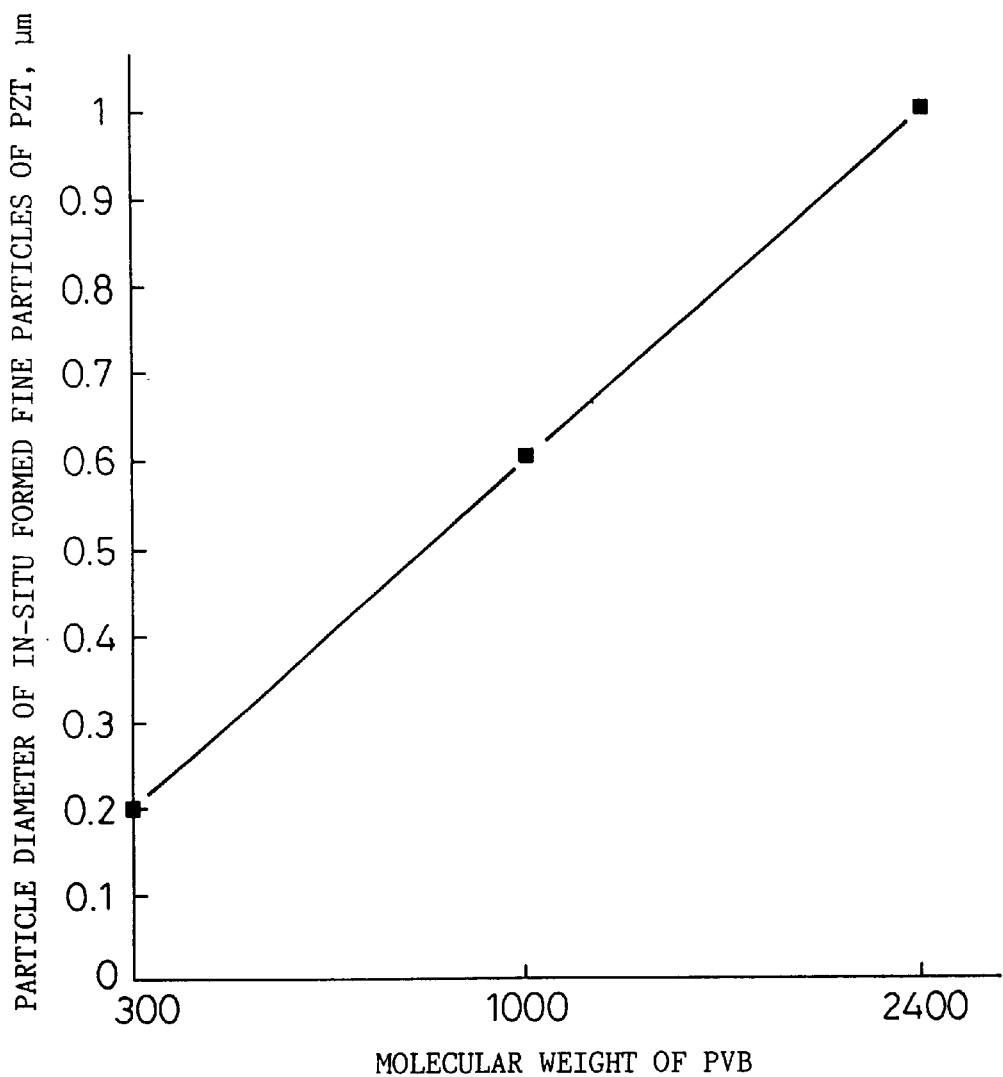
FIG. 7 is a graph showing the influence of the molecular weight of a PVB binder on the diameter of fine particles of in-situ formed fine particles of PZT.

After the preparation of the PZT precursor solution (I), a 25% butanol solution of PVB (weight average molecular weight=300, 1000, and 2400) was added to the solution. The ratio of PZT to PVB was 1:1. As a result of the evaluation test, it was found that, as can be understood from the results plotted in FIG. 7, the concentration of fine particles of PZT formed in situ increased with an increase in the molecular weight of PVB in the PVB solution.

Figure 8:
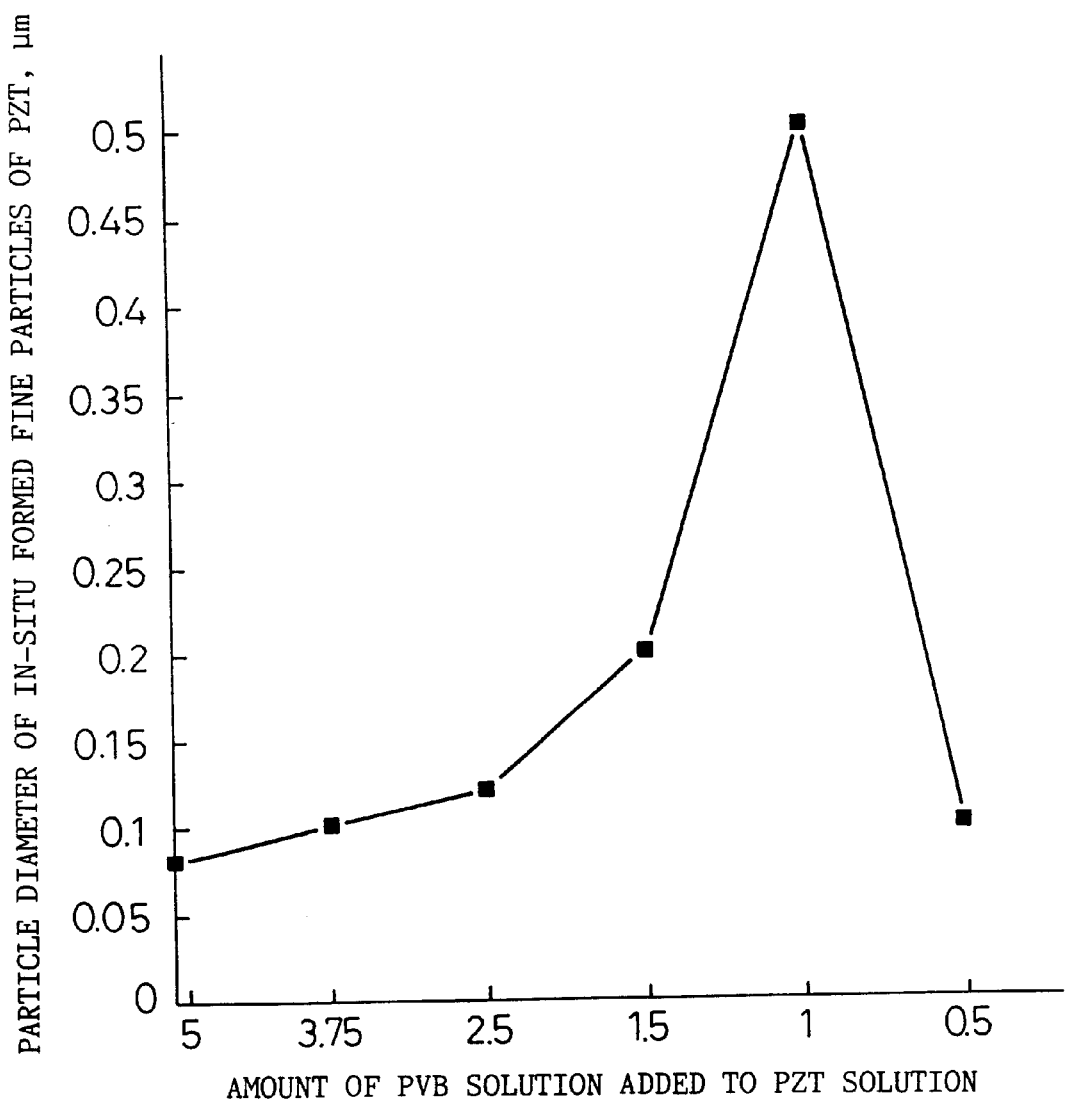
FIG. 8 is a graph showing the influence of the added amount of a PVB solution on the diameter of in-situ formed fine particles of PZT.

(3) A change in diameter of the fine particles of PZT formed in situ in the thin film of PZT as a function of the amount of a 25% butanol solution of PVB added to the PZT precursor solution (I) After the preparation of the PZT precursor solution (I), a 25% butanol solution of PVB (weight average molecular weight=300) was added to the solution. The amount of the PVB solution added based on the PZT solution was 50%, 100%, 150%, 250%, 375%, and 500%. As a result of the evaluation test, it was found that, as can be understood from the results plotted in FIG. 8, regarding the concentration of fine particles of PZT formed in situ, the most favorable results could be provided when the amount of the PVB solution added to the PVB solution (in other words, the amount of the solvent in the system) was equal to that of the PZT solution.

Example 13

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze titanium tetraisopropoxide. After the mixture was refluxed for 8 hr, 0.0188 mol of ethoxyethanol was added thereto, followed by reflux for 30 min. The reflux temperature was 82.4° C., the boiling point of isopropanol. 2.79 g (0.0094 mol) of diethoxylead was added to the titanium precursor solution, and the reflux was continued for additional 30 min. Thus, a titanium lead precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in an increased molecular weight of the zirconium tetra-n-butoxide. Thus, a zirconium precursor solution was prepared. 3.15 g (0.0106 mol) of diethoxylead was added to the zirconium precursor solution, and the reflux was continued for additional 30 min. Thus a zirconium lead precursor solution was prepared.

The titanium lead precursor solution and the zirconium lead precursor solution, which had been prepared separately from each other, were mixed together, and the reflux was continued at 82.4° C. for 30 min. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has-been taken into consideration, and the preparation and mixing were performed so that the finally formed thin film of PZT had a desired composition ratio (Pb:Zr:Ti:O= 1:0.53:0.47:3).

After the preparation of the PZT precursor solution (I), a butanol solution of polyvinyl butyral (PVB, weight average molecular weight=300) was added to the precursor solution in order to increase the viscosity and to perform subsequent gelation, and the mixture was thoroughly stirred at room temperature. The butanol solution of PVB used herein was prepared by dissolving PVB in butanol to a concentration of 25%, and the amount of the butanol solution added was 40% based on the molar concentration of the metal in the PZT precursor solution (I).

Addition of the butanol solution of PVB to the PZT precursor solution (I) followed by stirring developed the same behavior as described in Example 11, and a sol-gel-like PZT precursor coating solution containing homogeneously dispersed fine particles of PZT was prepared.

Subsequently, in order to form a thin film of PZT, a platinum electrode was formed by sputtering in a quartz substrate in its predetermined area. The PZT precursor coating solution containing fine particles of PZT was coated onto the platinum electrode by means of a bar coater and dried at 150° C. for 10 min. Thereafter, the coating was prefired at 500° C. for one hr in order to decompose and remove the previously added PVB, and finally fired at 650° C. for one hr. As a result of the annealing, the crystallization of PZT proceeded to provide a thin film of PZT having a perovskite structure. The thickness of the thin film of PZT was 10 $\mu$m. As with the thin film of PZT in Example 11, the thin film of PZT thus formed was satisfactory.

Example 14

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze titanium tetraisopropoxide. After the mixture was refluxed for 8 hr at 82.4° C., the boiling point of isopropanol, 0.0188 mol of ethoxyethanol was added thereto. Thus, a titanium precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in increased molecular weight of the zirconium tetra-nbutoxide. Thus, a zirconium precursor solution was prepared.

The titanium precursor solution and the zirconium precursor solution, which had been prepared separately from each other, were mixed together, and the reflux was continued for 0.5 hr. 5.94 g (0.02 mol) of diethoxylead was added to the mixture, and the mixture was refluxed at 82.4° C. for 0.5 hr. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has been taken into consideration, and the preparation and mixing were performed so that the finally formed thin film of PZT had a desired composition ratio (Pb:Zr:Ti:O=1:0.53:0.47:3).

After the preparation of the PZT precursor solution (I), a butanol solution of polyvinyl butyral (PVB, weight average molecular weight=300) was added to the precursor solution in order to increase the viscosity and to perform subsequent gelation, and the mixture was thoroughly stirred at room temperature. The butanol solution of PVB used herein was prepared by dissolving PVB in butanol to a concentration of 25%, and the amount of the butanol solution added was 40% based on the molar concentration of the metal in the PZT precursor solution (I). PVB was coordinated to PZT, and the coordination of PVB resulted in a change in solubility of PZT and initiation of precipitation and agglomeration of PZT depending upon the molecular weight of PVB and the amount of the solvent in the system. This has led to the initiation of the growth of the contemplated fine particles of PZT. As a result, a sol-gel-like PZT precursor coating solution containing homogeneously dispersed fine particles of PZT was prepared.

Stirring was further continued to permit gelation to proceed, and the sol-gel-like PZT precursor coating solution was screen-printed to form a coating having a shape corresponding to a desired green sheet. Subsequently, the coating was dried at 150° C. for 10 min to evaporate the solvent in the coating, thereby preparing a PZT green sheet with fine particles of PZT being covered with PVB as the binder and the PZT precursor remaining unagglomerated. Since this PZT green sheet per se does not develop ferroelectricity and piezoelectricity, it was fired in the atmosphere at 600° C. for one hr. As a result of the firing, the crystallization of PZT proceeded to provide a PZT element in a thick film form having a perovskite structure. The thickness of the PZT element was 20 μm.

Example 15

2.67 g (0.0094 mol) of titanium tetraisopropoxide was dissolved in 100 g of isopropanol to prepare a titanium solution. In order to increase the molecular weight of the titanium tetraisopropoxide, 100 g of an isopropanol solution of 0.001 N hydrochloric acid was gradually added to the titanium solution to hydrolyze titanium tetraisopropoxide. After the mixture was refluxed for 8 hr, 0.0188 mol of ethoxyethanol was added thereto, followed by reflux for 30 min. The reflux temperature was 82.4° C., the boiling point of isopropanol. 2.79 g (0.0094 mol) of diethoxylead was added to the titanium precursor solution, and the reflux was continued for additional 30 min. Thus, a titanium lead precursor solution was prepared.

Separately, 4.06 g (0.0106 mol) of zirconium tetra-n-butoxide was dissolved in 100 g of isopropanol to prepare a zirconium solution. 0.0212 mol of ethoxyethanol was added to the zirconium solution, and 100 g of an isopropanol solution of 0.001 N hydrochloric acid was gradually added to perform hydrolysis. Reflux at 82.4° C. for 8 hr resulted in increased molecular weight of the zirconium tetra-n-butoxide. Thus, a zirconium precursor solution was prepared. 3.15 g (0.0106 mol) of diethoxylead was added to the zirconium precursor solution, and the reflux was continued for additional 30 min. Thus a zirconium lead precursor solution was prepared.

The titanium lead precursor solution and the zirconium lead precursor solution, which had been prepared separately from each other, were mixed together, and the reflux was continued at 82.4° C. for 30 min. Thus, a PZT precursor solution (I) was prepared. In this connection, it should be noted that the ratio of Zr to Ti in PZT is closely related to the ferroelectricity. Therefore, in the preparation of the isopropanol solutions followed by mixing of these solutions, this has been taken into consideration, and the preparation and mixing were performed so that the finally formed thin film of PZT had a desired composition ratio (Pb:Zr:Ti:O= 1:0.53:0.47:3).

After the preparation of the PZT precursor solution (I), a butanol solution of polyvinyl butyral (PVB, weight average molecular weight=300) was added to the precursor solution in order to increase the viscosity and to perform subsequent gelation, and the mixture was thoroughly stirred at room temperature. The butanol solution of PVB used herein was prepared by dissolving PVB in butanol to a concentration of 25%, and the amount of the butanol solution added was 40% based on the molar concentration of the metal in the PZT precursor solution (I).

Addition of the butanol solution of PVB to the PZT precursor solution (I) followed by stirring developed the same behavior as described in Example 11, and a sol-gel-like PZT precursor coating solution containing homogeneously dispersed fine particles of PZT was prepared.

Stirring was further continued to permit gelation to proceed, and the sol-gel-like PZT precursor coating solution was screen-printed to form a coating having a shape corresponding to a desired green sheet. Subsequently, the coating was then dried at 150° C. for 10 min to evaporate the solvent in the coating, thereby preparing a PZT green sheet with fine particles of PZT being covered with PVB as the binder and the PZT precursor remaining unagglomerated. Since this PZT green sheet per se does not develop ferroelectricity and piezoelectricity, it was fired in the atmosphere at 600° C. for one hr. As a result of the firing, the crystallization of PZT proceeded to provide a PZT element in a thick film form having a perovskite structure. The thickness of the PZT element was 20 μm.

INDUSTRIAL APPLICABILITY

According to the present invention, a titanium alkoxide and a zirconium alkoxide are separately hydrolyzed in the presence of an acid catalyst to increase the molecular weight of the alkoxides, followed by the addition of a heat-decomposable polymer material to modify the viscosity of a ferroelectric precursor solution. This constitution enables the preparation of a ferroelectric element free from cracking despite a large film thickness.

Further, in the present invention, a binder is added to a ferroelectric sol gel prepared using metal alkoxides to permit a sol gel reaction to proceed, resulting in ferroelectric fine particles in the same sol-gel solution. Coating of the thus formed sol-gel solution containing ferroelectric fine particles onto a substrate, and the coating followed by drying and firing surprisingly enables the preparation of a ferroelectric element in a thin film form, which is more dense than that prepared by the conventional method, in a shortened time.

Further, the preparation of a green sheet using a sol-gel process according to the present invention enables the firing temperature to be lowered as compared with the preparation of the conventional ferroelectric element, which in turn can broaden the range of selection of an electrode, for covering both ends of a green sheet, which is necessary for the development of ferroelectricity and piezoelectricity.

In addition, application of the ferroelectric element of the present invention as a piezoelectric element to a piezoelectric ink jet head can, of course, offer excellent piezoelectric properties and, further, permits an electrode to be easily formed on the piezoelectric element without creating any defect.

What is claimed is:

1. A process for producing a ferroelectric element of a ferroelectric material containing at least two metals, comprising the steps of:

providing a solution of alkoxides of the at least two metals;

hydrolyzing the metal alkoxides in the presence of a catalytic amount of a protonic acid to increase a molecular weight thereof and form a sol-like solution;

adding a film-forming polymer material to the resultant sol-like solution to form a sol-like ferroelectric precursor solution;

adding a binder material to the sol-like ferroelectric precursor solution to produce fine particles of the ferroelectric precursor in the sol-like ferroelectric precursor solution; and forming said ferroelectric element from the resultant sol-like ferroelectric precursor solution containing said fine particles.

2. The process for producing a ferroelectric element according to claim 1, in which the binder material, is added to the sol-like ferroelectric precursor solution in an amount effective to accelerate gelation of the solution and produce the fine particles of the ferroelectrical precursor in the solution.

3. The process for producing a ferroelectric element according to claim 2, wherein, during the addition of the binder material to the sol-like ferroelectric precursor solution, the binder material is added in an amount large enough to produce a sol-gel ferroelectric precursor solution containing said fine particles, the sol-gel solution being formed into a green sheet having a predetermined shape which is then fired to form the ferroelectric element.

4. The process for producing a ferroelectric element according to claim 1 or 2, wherein the ferroelectric element is formed by coating the sol-like ferroelectric precursor solution containing said fine particles on a substrate and then drying the coating, the steps of coating and drying being repeated to obtain a predetermined coating thickness and thereafter firing the coating to form a thin-film ferroelectric element.

5. The process for producing a ferroelectric element according to claim 4, wherein the sol-like ferroelectric precursor solution is coated on the substrate by doctor blade coating, roll coating, bar coating, or screen printing.

6. The process for producing a ferroelectric element according to claim 1 or 2, wherein the ferroelectric material is a ceramic having a perovskite structure.

7. The process for producing a ferroelectric element according to claim 6, wherein the ceramic is lead zirconate titanate.

* * * * *